US010436666B2

(12) United States Patent
Chabchoub et al.

(10) Patent No.: US 10,436,666 B2
(45) Date of Patent: Oct. 8, 2019

(54) SENSOR INTERFACE FOR HOSTILE ENVIRONMENTS

(71) Applicant: Commissariat à l'Énergie Atomique et aux Énergies Alternatives, Paris (FR)

(72) Inventors: Emna Chabchoub, Grenoble (FR); Franck Badets, Voiron (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/786,293

(22) Filed: Oct. 17, 2017

(65) Prior Publication Data

US 2018/0106695 A1    Apr. 19, 2018

(30) Foreign Application Priority Data

Oct. 18, 2016    (FR) ..................... 16 60100

(51) Int. Cl.
| | |
|---|---|
| *G01L 23/08* | (2006.01) |
| *H03L 7/06* | (2006.01) |
| *H03L 7/24* | (2006.01) |
| *H04L 7/027* | (2006.01) |
| *H04L 7/033* | (2006.01) |
| *G01D 21/00* | (2006.01) |
| *G01D 5/243* | (2006.01) |

(52) U.S. Cl.
CPC .............. *G01L 23/08* (2013.01); *G01D 21/00* (2013.01); *H03L 7/06* (2013.01); *H03L 7/24* (2013.01); *H04L 7/027* (2013.01); *H04L 7/033* (2013.01); *G01D 5/243* (2013.01)

(58) Field of Classification Search
CPC .. G01L 23/08; G01L 23/085; G01L 23/10–18
See application file for complete search history.

(56) References Cited

U.S. PATENT DOCUMENTS 8,542,779 B2 * 9/2013 Xu ................. H04L 27/2272
                                                 331/2
8,804,397 B2 * 8/2014 Aleksic ................ H03L 7/24
                                                 365/129

(Continued)

FOREIGN PATENT DOCUMENTS

WO    WO 2007/068283 A1    6/2007

OTHER PUBLICATIONS

French Search Report for Application No. FR 1660100 dated Jun. 27, 2017.

(Continued)

*Primary Examiner* — Thomas J. Hiltunen
(74) *Attorney, Agent, or Firm* — Wolf, Greenfield & Sacks, P.C.

(57) ABSTRACT

An interface circuit for a sensor including: a first injection-locked oscillator having: a first input coupled to a sensor, a free-running oscillation frequency of the first injection-locked oscillator being controlled by a signal from the sensor; and a second input coupled to receive a synchronization signal at a reference frequency, the first injection-locked oscillator being adapted to generate an output signal at said reference frequency, the output signal being phase shifted with respect to the synchronization signal as a function of the signal from the sensor.

16 Claims, 5 Drawing Sheets

(56) References Cited

U.S. PATENT DOCUMENTS

| | | | | |
|---|---|---|---|---|
| 8,975,973 B2* | 3/2015 | Sato | ............ | H03L 7/16 331/172 |
| 9,219,486 B2* | 12/2015 | Raj | ............ | H03B 27/00 |
| 9,425,905 B2* | 8/2016 | Lee | ............ | H04B 13/005 |
| 9,435,767 B2* | 9/2016 | Schlereth | ............ | G01N 29/022 |
| 9,722,619 B2* | 8/2017 | Siligaris | ............ | H03L 7/18 |
| 9,966,661 B2* | 5/2018 | Xue | ............ | H01Q 3/34 |
| 10,084,462 B2* | 9/2018 | Yonezawa | ............ | H03L 7/095 |
| 2003/0137361 A1* | 7/2003 | Knecht | ............ | H03L 1/025 331/176 |
| 2010/0073096 A1* | 3/2010 | Gupta | ............ | H03L 1/022 331/35 |
| 2017/0194966 A1* | 7/2017 | Yonezawa | ............ | H03L 1/025 |

OTHER PUBLICATIONS

Asua et al., A Novel Micro- and Nano-Scale Positioning Sensor Based on Radio Frequency Resonant Cavities. Sensors. May 30, 2014; 14: 9615-27.

Bianchi et al., ALC Crystal Oscillators Based Pressure and Temperature Integrated Measurement System for High Temperature Oil Well Applications. Joint Meeting EFTF—IEEE IFCS. 1999; 1058-61.

Cheng et al., A Low-Power Oscillator-Based Readout Interface for Medical Ultrasonic Sensors. 2016 International Symposium on VLSI Design, Automation and Test (VLSI-DAT) IEEE. Apr. 25, 2016, pp. 1-4.

Chien et al., A 6.5/11/17.5/30-GHz High Throughput Interferometer-based Reactance Sensors using Injection-Locked Oscillators and Ping-Pong Nested Chopping. IEEE Symposium on VLSI Circuits Digest of Technical Papers. 2014.

Chien et al., Design and Analysis of Chopper Stabilizaed Injection-Locked Oscillator Sensors Employing Near-Field Modulation. IEEE J. of Solid-State Circuits. Aug. 2016; 51(8):1851-65.

Davis et al., A 14-Bit High-Temperature $\Sigma\Delta$ A Modulator in Standard CMOS. IEEE J. of Solid-State Circuits. Jun. 2003; 38(6): 976-86.

De Smedt et al., A Novel, Highly Linear, Voltage and Temperature independent Sensor Interface Using Pulse Width Modulation. Elsevier. Procedia Engineering. Sep. 9-12, 2012; 47: 1215-18.

Demeûs et al., High-Temperature Analog Instrumentation System in Thin-Film Fully-Depleted SOI CMOS Technology. IEEE. 1998; 51-4.

Jaafar et al., New PLL Based Signal Conditioning Circuitry for Capacitive Sensors. IEEE Workshop on Advanced Research and Technology in Industry Applications. 2014; 7-12.

Shoucair. Design Considerations in High Temperature Analog CMOS Integrated Circuits. IEEE Transactions on Components, Hybrids, and Manufacturing Technology. Sep. 1986; v.CHMT-9(3): 242-51.

European Search Report for Application No. EP 17 19 6830 dated Mar. 6, 2018.

Razavi, A Study of Injection Locking and Pulling in Oscillators. IEEE J of Solid-State Circuits. Sep. 2004;39(9):1415-24.

* cited by examiner

SENSOR INTERFACE FOR HOSTILE ENVIRONMENTS

This application claims the priority benefit of French patent application number 16/60100, filed on Oct. 18, 2016, the content of which is hereby incorporated by reference in its entirety to the maximum extent allowable by law.

FIELD

The present disclosure relates to the field of interfaces for sensors, and in particular to an interface for a sensor having a high tolerance to parameter variations resulting from hostile environments.

BACKGROUND

For certain applications, it is desirable to place sensors in hostile environments, such as environments having extremes of temperature, high levels of radiation, or in which very little power is available, leading to very low supply voltages. A difficulty in such hostile environments is that circuits may no longer operate correctly in view of the parameter variations resulting from the environment. For example, the current leakage in a circuit increases exponentially with temperature, leading to failure when the temperature reaches a certain level. For example, sensors may be used to control and/or monitor the operation of aeroplane engines, where the temperature may rise as high as 250° C., leading to high current leakage and potential failures.

While some solutions have been proposed for providing sensor interfaces that are to some extent robust against errors resulting from the environment, for certain applications there is a need for a sensor interface providing greater precision in hostile environments.

SUMMARY

It is an aim of embodiments of the present disclosure to at least partially address one or more needs in the prior art.

According to one aspect, there is provided an interface circuit for a sensor comprising: a first injection-locked oscillator having: a first input coupled to a sensor, a free-running oscillation frequency of the first injection-locked oscillator being controlled by a signal from the sensor; and a second input coupled to receive a synchronization signal at a reference frequency, the first injection-locked oscillator being adapted to generate an output signal at said reference frequency, the output signal being phase shifted with respect to the synchronization signal as a function of the signal from the sensor.

According to one embodiment, the interface circuit further comprises: an output circuit adapted to generate a digital output signal based on a phase difference between the output signal and the synchronization signal or a further reference signal.

According to one embodiment, the output circuit is adapted to generate the digital output signal based on a phase difference between the output signal and a further reference signal generated by a second injection-locked oscillator having: a first input for controlling a free-running oscillation frequency of the second injection-locked oscillator; and a second input coupled to receive the synchronization signal.

According to one embodiment, the first input of the second injection-locked oscillator is coupled to the sensor.

According to one embodiment, the sensor comprises first and second differential outputs, the free-running oscillation frequency of the first injection-locked oscillator being controlled based on a first differential output signal of the sensor, and the free-running oscillation frequency of the second injection-locked oscillator being controlled based on a second differential output signal of the sensor.

According to one embodiment, the output circuit further comprises: a first counter adapted to determine a phase offset between the output signal of the first injection-locked oscillator and the synchronization signal; a second counter adapted to determine a phase offset between the output signal of the second injection-locked oscillator and the synchronization signal; and a calibration circuit configured to adjust the free-running oscillation frequencies of both the first and second injection-locked oscillators based on a comparison between an average of the first and second phase offsets and a reference phase offset.

According to one embodiment, the output circuit comprises: a phase comparator; and a control circuit having an output coupled to the first input of the second injection-locked oscillator and adapted to generate a control signal for controlling the free-running oscillation frequency of the second injection-locked oscillator based on the phase comparison.

According to one embodiment, the interface circuit further comprises a sigma-delta modulator coupled to the output of the phase comparator, and a further comparator coupled to the output of the sigma-delta modulator, the control circuit being adapted to generate the control signal based an output signal of the further comparator.

According to one embodiment, the output circuit comprises: a phase comparator; and a control circuit having an output added to the first output signal of the sensor, the free-running oscillation frequency of the first injection-locked oscillator being controlled based on the sum of the first output signal and the control signal.

According to one embodiment, the output circuit comprises a counter adapted to generate the digital output value by incrementing a count value between a first edge of the output signal of the first injection-locked oscillator and a first edge of the synchronization signal or of a further reference signal.

According to one embodiment, the first injection-locked oscillator comprises: an oscillator comprising first and second capacitors charged or discharged based on a first current signal generated based on said first output signal of the sensor; and an injection locking circuit adapted to charge or discharge the first and second capacitors based on the synchronization signal.

According to one embodiment, the first injection-locked oscillator further comprises a flip-flop adapted to be clocked based on a voltage across the first capacitor and reset based on a voltage across the second capacitor.

According to a further embodiment, there is provided a method of outputting a sensor signal comprising: controlling a free-running oscillation frequency of a first injection-locked oscillator by a signal from a sensor coupled to a first input of the first injection-locked oscillator; and locking the frequency of an output signal of the first injection-locked oscillator to a reference frequency by applying a synchronization signal at the reference frequency to a second input of the first injection-locked oscillator, the output signal being phase shifted with respect to the synchronization signal as a function of the signal from the sensor.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to designate a direct connection between two elements, whereas the term "coupled" is used to designate a connection that could be direct, or could be via one or more intermediate elements such as resistors, capacitors or transistors.

Figure 1:
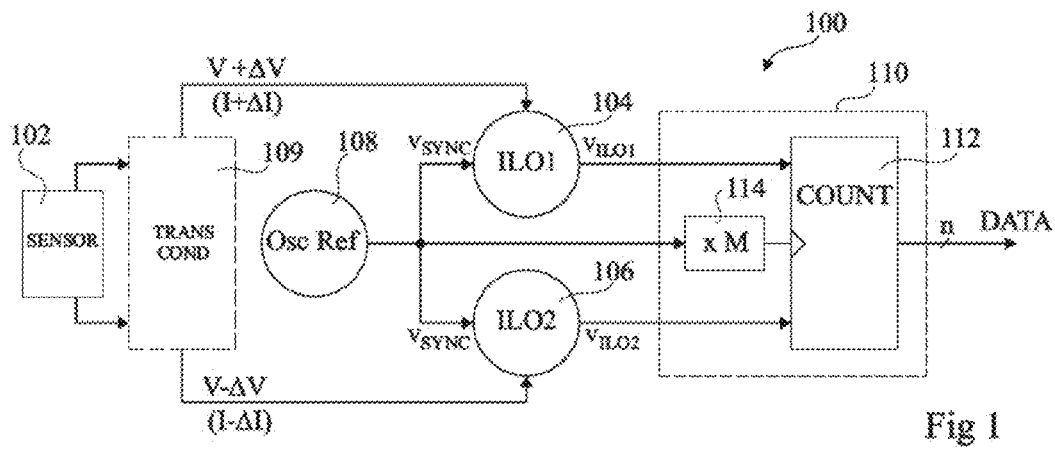
FIG. 1 schematically illustrates a sensor interface according to an example embodiment of the present disclosure.

FIG. 1 schematically illustrates a sensor interface 100 according to an example embodiment. A sensor 102 for example provides differential output signals, which may be differential voltage signals of the form $V+\Delta V$ and $V-\Delta V$, where V is the common-mode voltage level and $2\Delta V$ is the voltage signal representing the value sensed by the sensor 102, or differential current signals $I+\Delta I$, $I-\Delta I$, where I is the common-mode current level, and $2\Delta I$ is current signal representing the value sensed by the sensor 102.

The sensor 102 is for example a temperature sensor, radiation sensor, orientation sensor, or any other sensor generating an output signal.

The differential output signals of the sensor 102 are respectively provided to injection-locked oscillators (ILO1, ILO2) 104 and 106. In particular, one output of the sensor 102 is coupled to an input of the ILO 104 for controlling a free-running oscillation frequency f0 of the oscillator 104, and the other output of the sensor 102 is coupled to an input of the ILO 106 for controlling a free-running oscillation frequency f0' of the oscillator 106. A further input of each of the oscillators 104, 106 is coupled to the output of a reference oscillator 108, which for example generates a synchronization signal VSYNC at a reference frequency fSYNC. The oscillators 104, 106 respectively generate output signals VILO1, VILO2 at this reference frequency fSYNC. However, the phase of each of the signals VILO1, VILO2 is a function of the corresponding sensor output signal, and thus there will be a phase difference between the signals VILO1, VILO2 that varies as a function of the sensor output signal $2\Delta V$ or $2\Delta I$.

In some embodiments, the sensor 102 generates differential voltage signals, and the free-running oscillation frequencies f0, f0' of the oscillators 104, 106 are respectively controlled directly by these voltage signals. In alternative embodiments, the sensor 102 generates differential current signals, and the free-running oscillation frequencies f0, f0' of the oscillators 104, 106 are respectively controlled directly by these current signals. In the case that the sensor 102 generates differential voltage signals and the free-running oscillation frequencies f0, f0' of the oscillators 104, 106 are respectively controlled by current signals, a transconductance circuit (TRANS COND) 109 is for example coupled between the outputs of the sensor 102 and the oscillators 104, 106 in order to convert the differential voltage signals into differential current signals.

In alternative embodiments, rather than generating a current or voltage signal, the sensor 102 could be a resistive or capacitive sensor, incorporated or embedded within each injection locked oscillator 104, 106. In this way, the signal from the sensor resulting from variations of the sensing element directly changes the free-running frequency of each oscillator.

An output circuit 110 is for example adapted to generate a digital output signal DATA representing the sensor output signal based on the phase difference between the signals VIOL1, VILO2. The output circuit 110 is for example a time to digital converter (TDC) performing time to digital conversion, and generates a digital signal representing the magnitude, and in some embodiments the sign, of the phase difference between the output signals VIOL1, VILO2. For example, the output circuit 110 comprises a counter circuit (COUNT) 112 adapted to increment a count value during an interval between corresponding edges of the signals VILO1, VIOL2. The counter circuit 112 is for example clocked by a signal having a frequency at a multiple M of the reference frequency fSYNC, generated for example by a frequency multiplier 114, although this clock signal could be generated in other ways. The count value then provides the digital output signal. The multiple M is for example equal to or greater than two and in some embodiments in the hundreds or thousands.

An injection-locked oscillator (ILO) is a type of oscillator that has a free-running oscillation frequency f0 when no input signals are applied to it, and if a synchronization signal VSYNC is applied to it having a frequency fSYNC that is within certain limits of the frequency f0, the oscillator will lock onto this frequency, as will now be explained with reference to FIG. 2.

Figure 2:
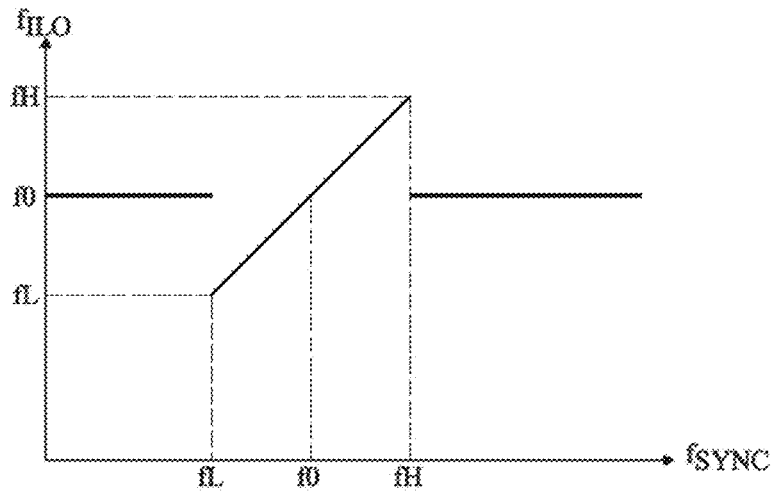
FIG. 2 is a graph illustrating a relation between a synchronizing frequency and an oscillating frequency of an injection-locked oscillator of the interface of FIG. 1 according to an example embodiment.

FIG. 2 is a graph illustrating the output frequency fILO of each of the oscillators 104, 106 of FIG. 1 as a function of the reference frequency fSYNC of the synchronization signal VSYNC. As illustrated, when the reference frequency fSYNC is in a range fL to fH, centred on the free-running frequency f0 of the ILO, the frequency fILO of the output signal of the ILO will match the reference frequency fSYNC. The oscillator locking range will depend on the oscillator topology and the strength of the locking signal. As just one example, a locking range from 20 kHz to 50 kHz could be obtained for an oscillator having a free running frequency of around 35 kHz. Outside the frequency range fL to fH, the oscillating frequency fILO is for example at the free-running oscillation frequency f0 of the oscillator.

An ILO has the property that the phase difference ØOUT/SYNC between the synchronization signal VSYNC and the output signal VILO is a function of the frequency difference between the free-running oscillation frequency f0 and the reference frequency fSYNC. In other words:

$$\emptyset_{OUT/SYNC} = F(f_{SYNC} - f0)$$

In some embodiments, the ILOs 104, 106 are chosen such that the function F( ) is linear or substantially linear.

Thus, by using the output signals of the sensor 102 to modify the free-running oscillation frequencies f0, f0' of the oscillators 104, 106 respectively, the sensor output signals are converted into corresponding phase shifts of the synchronizing signal VSYNC, as will now be described in more detail with reference to FIGS. 3A and 3B.

Figure 3A:
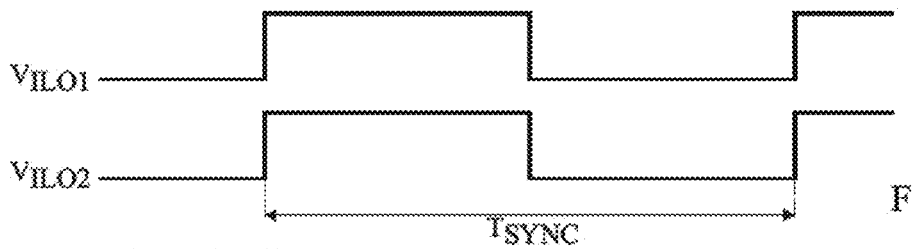
FIGS. 3A and 3B are timing diagrams illustrating signals at the outputs of the injection oscillators of FIG. 1 according to an example embodiment.

FIG. 3A is a timing diagram illustrating examples of the signals VILO1 and VILO2 at the outputs of the oscillators 104 and 106 respectively of FIG. 1. In the case in which the sensor 102 provides no output signal, in other words ΔV=0 or ΔI=0, the output signals VILO1 and VILO2 of the oscillators 104, 106 are for example in phase with each other, and each have a period tSYNC equal to 1/fSYNC.

Figure 3B:
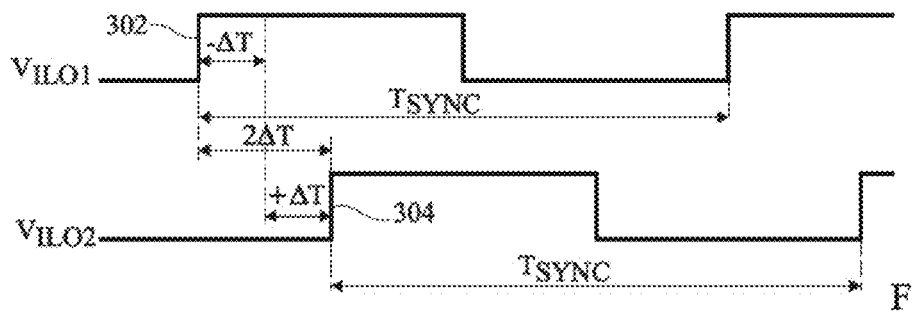

As shown in FIG. 3B, when the outputs of the sensor 102 are non-zero, in other words ΔV≠0 or ΔI≠0, the phases of the signals VILO1 and VILO2 are modified in opposite directions from each other. For example, when ΔV is positive, the phase of the signal VILO1 is for example reduced by an amount −ΔT, and the phase of the signal VILO2 is for example increased by an amount +ΔT, leading to a phase difference between the signals VILO1 and VILO2 of 2ΔT. Thus, while the periods of the signals VILO1 and VILO2 remain at tSYNC, the phase difference between these signals becomes a function of the differential output signals of the sensor 102.

In the case that the output circuit 110 of FIG. 1 is implemented by a counter circuit 112, the counter is for example configured to start counting when the signal VILO1 goes high and to stop counting when the signal VILO2 goes high, in other words to count between a rising edge 302 of the signal VILO1 and a rising edge 304 of the signal VIOL2. In alternative embodiments, the phase difference between the signals VILO1 and VILO2 could be evaluated by counting during a period between falling edges of the signals. Furthermore, rather than being based on a single measurement, more than one count value could be generated by measuring the phase difference during several successive periods of the signals VILO1 and VILO2, and the output signal DATA is for example based on an average phase difference.

Figure 4:
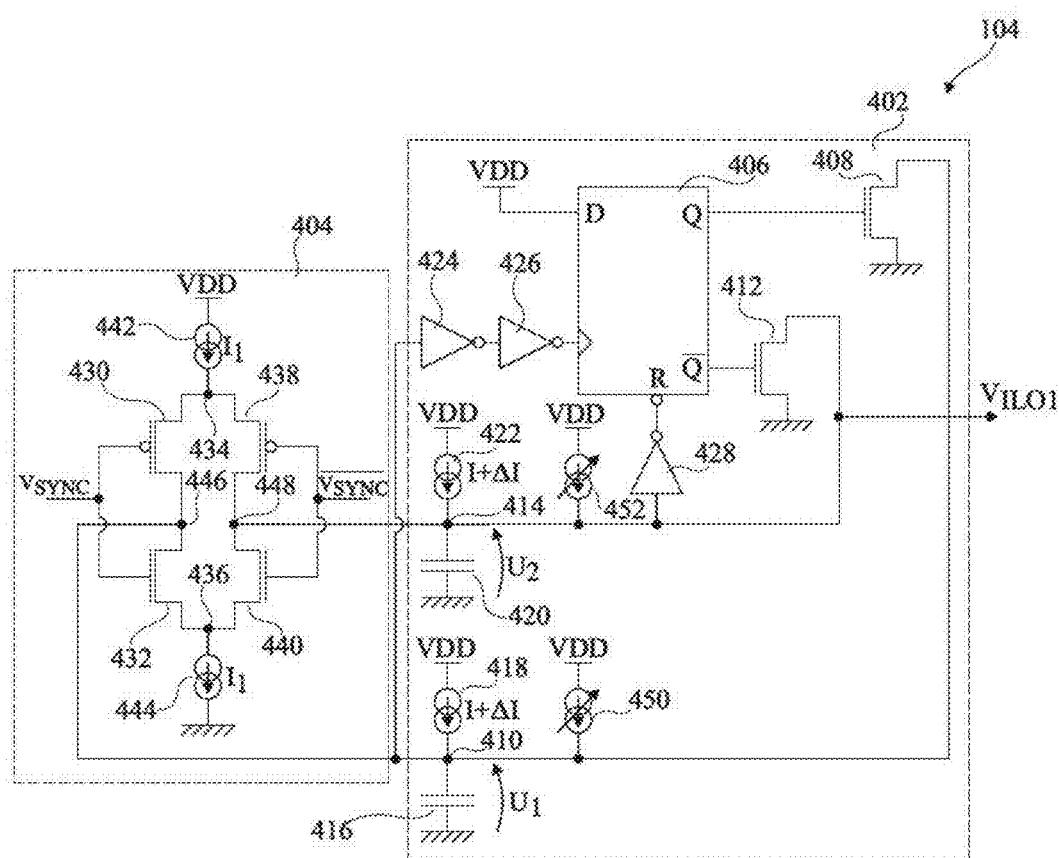
FIG. 4 schematically illustrates an injection-locked oscillator of FIG. 1 in more detail according to an example embodiment.

FIG. 4 schematically illustrates the injection-locked oscillator 104 of FIG. 1 in more detail according to an example embodiment. The oscillator 106 of FIG. 1 is for example implemented by a similar circuit to that of FIG. 4.

The ILO 104 for example comprises an oscillator 402 and an injection locking circuit 404. An ILO similar to the one shown in FIG. 4 is for example described in more detail in a publication by F. Badets et al. entitled "Synchronous Oscillator Locked Loop: A New Delay Locked Loop Using Injection Locked Oscillators as Delay Elements", DCIS 2004, Bordeaux pp 599-602.

The oscillator 402 is for example a relaxation oscillator. The oscillator is based on a D-type flip-flop 406 having its data input D coupled to the supply voltage VDD, and having outputs Q and $\overline{Q}$. The output $\overline{Q}$ for example provides the output signal VILO1 of the ILO 104. The output Q is for example coupled to the gate of the transistor 408, which is for example an n-channel MOS transistor coupled by its main conducting nodes between a first capacitive node 410 and ground. Similarly, the output $\overline{Q}$ of the flip-flop 406 is for example coupled to the gate of a further transistor 412, which is for example an n-channel MOS transistor coupled by its main conducting nodes between a capacitive node 414 and ground.

The node 410 is coupled to ground via a capacitor 416 and also receives a current from a current source 418, which represents the current I+ΔI provided by the sensor 102 or by the transconductance circuit 109 of FIG. 1. Similarly, the node 414 is coupled to ground via a capacitor 420, and receives a current from a current source 422, which also represents the current I+ΔI provided by the sensor 102 or by the transconductance circuit 109 of FIG. 1.

The node 410 is further coupled to the clock input of the flip-flop 406 via the series connection of a pair of inverters 424, 426. The node 414 is for example coupled to a reset input R of the flip-flop 406 via an inverter 428.

The injection-locking circuit 404 for example comprises a differential trans-impedance amplifier comprising transistors 430 and 432 coupled in series by their main conducting nodes between nodes 434 and 436, and transistors 438, 440 coupled by their main conducting nodes between the nodes 434 and 436. The transistors 430 and 438 are for example p-channel MOS (PMOS) transistors, and the transistors 432, 440 are for example n-channel MOS (NMOS) transistors. The gates of transistors 430 and 432 are for example coupled to receive the input signal VSYNC, and the gates of transistors 438, 440 are for example coupled to receive the inverse of the signal VSYNC. The node 434 is for example coupled to the supply voltage rail VDD via a current source 442 supplying a current I1, and the node 436 is for example coupled to the ground rail via a current source 444 also supplying the current I1. An intermediate node 446 between the transistors 430, 432 is for example coupled to the capacitive node 410, and an intermediate node 448 between the transistors 438, 440 is for example coupled to the capacitive node 414. The voltage at the node 410 across the capacitor 416 is labelled U1, and the voltage at the node 414 across the capacitor 420 is labelled U2.

In some embodiments, variable current sources 450, 452 may be coupled respectively to the nodes 410, 414 and permit the biasing current of the ILO to be calibrated, as will be described in more detail below.

Operation of the circuit of FIG. 4 will now be described in more detail with reference to FIG. 5.

Figure 5:
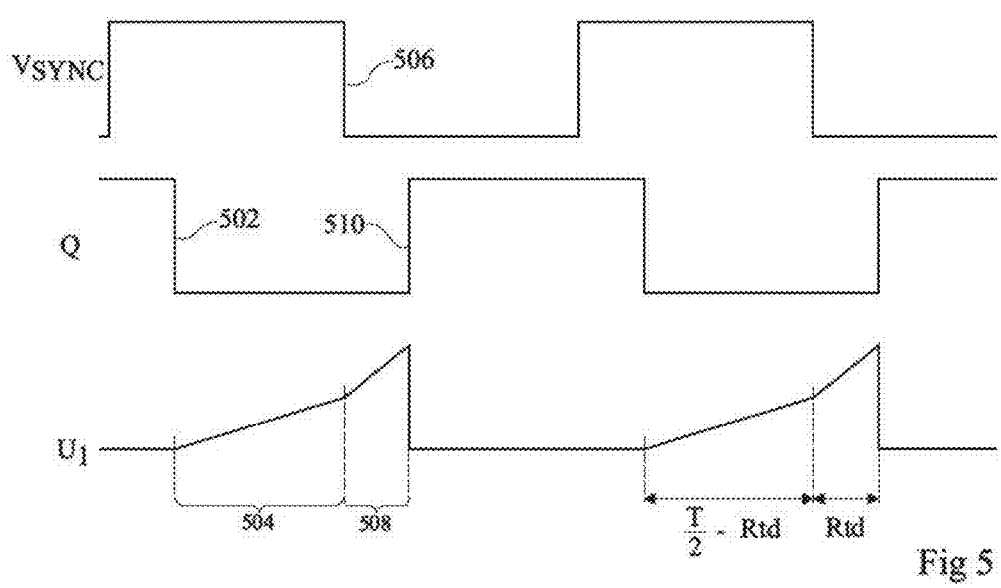
FIG. 5 is a graph illustrating an example of signals in the circuit of FIG. 4.

FIG. 5 is a timing diagram illustrating examples of the signals VSYNC, Q and U1 of the ILO 104 of FIG. 4.

The operation of the ILO 104 is based on the charging of the capacitors 416, 420 by the current sources. Assuming that the output signal Q of the flip-flop 406 is initially high, the transistor 412 is for example non-conducting, and the transistor 408 is for example conducting. The voltage U1 across the capacitor 416 is thus pulled to ground, and the capacitor 420 is charged by the current source 422 and also by the current source 442 while the signal VSYNC is high. When the voltage U2 reaches the threshold set by the inverter 428, the flip-flop 406 is reset, causing the output Q to go low, as shown by a falling edge 502 of the signal Q in FIG. 5. The transistor 412 then becomes conducting, and the transistor 408 becomes non-conducting. The voltage U2 at the node 414 will thus be pulled to ground, and the voltage U1 at the node 410 will be charged by the current source 418. The signal VSYNC is high during a first period 504 after Q goes low, and thus the node 410 is discharged by the current source 444. Thus the voltage U1 rises with a relatively low gradient. At the end of the period 504, the signal VSYNC goes low, as represented by a falling edge 506 in FIG. 5, and then during a subsequent period 508 the voltage U1 rises with a higher gradient, the node 410 being charged by both the current sources 418 and 442. Once the voltage U1 reaches the threshold set by the inverter 424, the output of the inverter 426 will go high, clocking the flip-flop 406, and causing its output Q to go high, as represented by a rising edge 510 in FIG. 5.

The free-running oscillation frequency f0 of the oscillator 104 is based on the current I0 of the current sources 418, 422, which in the example of FIG. 4 is equal to I+ΔI, according to the following equation:

$$f0 = \frac{I_0}{2CV_{th}}$$

where C is the capacitance of the capacitors 416, 420 and Vth is the threshold voltage of the inverters 424, 428. Thus the free-running oscillation frequency f0 is directly proportional to the current I0.

Furthermore, as shown in FIG. 5, the duration of half a period, TSYNC/2, of the output signal Q is equal to the sum of the durations of the periods 504 and 508, and can be expressed as:

$$\frac{T_{SYNC}}{2} \cdot <I> = (I_0 + I_1) \cdot Rtd + (I_0 - I_1) \cdot \left(\frac{T_{SYNC}}{2} - Rtd\right)$$

where I0 is the current provided by each of the current sources 418, 422, I1 is the current provided by each of the current sources 442, 444, <I> is the average current flowing into the oscillator capacitor 416 during one half of the synchronization period, and Rtd is the amount of overlap between high pulses of the signals Q and VSYNC.

The phase shift ØOUT/SYNC at the output of the oscillator can be shown to equal:

$$\phi_{OUT/SYNC} = 2\pi \cdot \frac{1}{4}\left[\frac{T0}{T_{SYNC}} \frac{I0}{I_{SYNC}} - \left(\frac{I0}{I_{SYNC}} - 1\right)\right]$$

where T0 is the period of the free running oscillator, TSYNC is the period of the synchronizing signal, I0 is the biasing current of the free-running oscillator and ISYNC is the current injected in the oscillator, equal to I1. Thus the ILO of FIG. 4 has the advantage that the phase shift has linearity over the entire synchronization range, in other words for fSYNC in the range from fL to fH.

Figure 6:
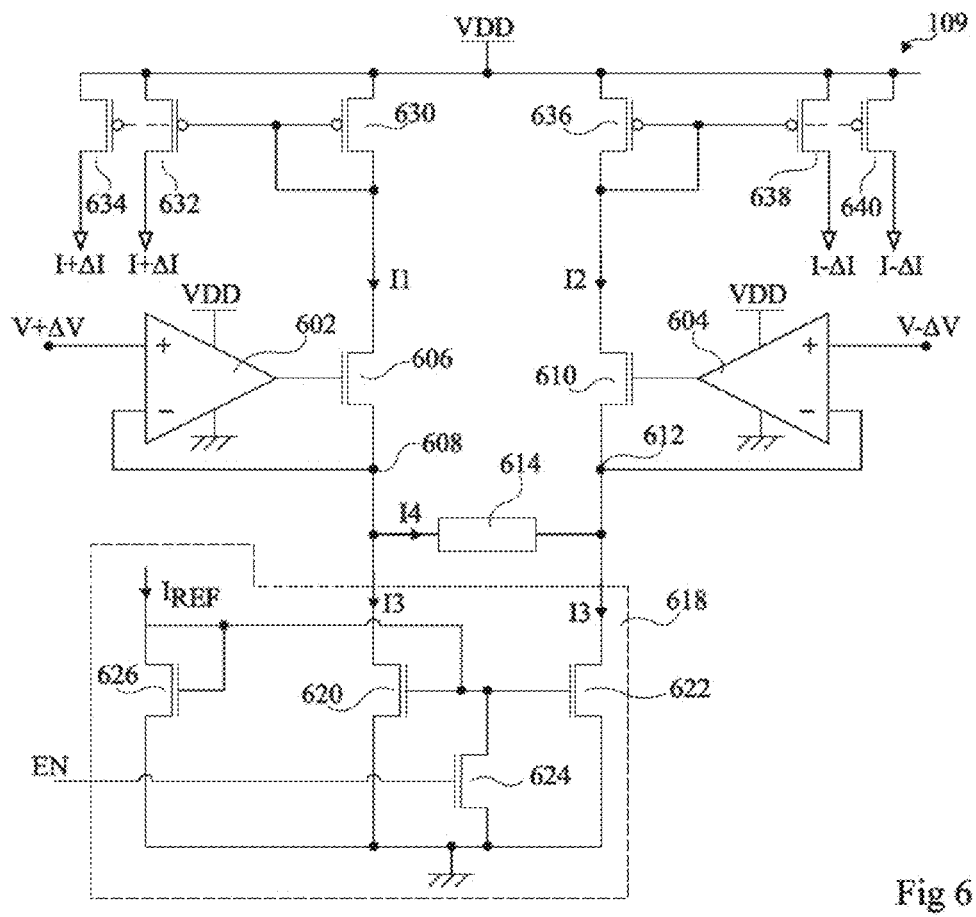
FIG. 6 schematically illustrates a transconductance circuit of FIG. 1 according to an example embodiment.

FIG. 6 schematically illustrates the transconductance circuit 109 of FIG. 1 according to an example embodiment. As indicated above, the transconductance circuit 109 is for example used to generate current signals for altering the free-running oscillation frequency of the ILOs 104, 106 in the case that the sensor outputs differential voltage signals.

The differential voltages V+ΔV and V−ΔV provided by the sensor 102 are for example respectively applied to positive inputs of differential amplifiers 602, 604. An output of the amplifier 602 is coupled to the control node of a transistor 606. The transistor 606 is for example an n-channel MOS transistor having its source 608 coupled to the negative input of the amplifier 602. Similarly, the output of the amplifier 604 is for example coupled to the control node of a transistor 610. The transistor 610 is for example an n-channel MOS transistor having its source node 612 coupled to the negative input of the amplifier 604. In this way, the currents I1 and I2 respectively passing through the transistors 606 and 610 are a function of the differential input signals V+ΔV and V−ΔV.

The nodes 608, 612 are for example coupled together via a trans-impedance 614. Furthermore, the nodes 608 and 612 are each coupled to a current mirror circuit 618, which pulls a current I3 through each of the branches. The current I4 through the trans-impedance 614 is thus equal to I1-I3 and to I3-I2.

The current mirror circuit 618 for example comprises an NMOS transistor 620 coupled by its main conducting nodes between the node 608 and the ground supply rail, and an NMOS transistor 622 coupled by its main conducting nodes between the node 612 and the ground rail. The gates of the transistors 620 and 622 are for example coupled together, and to the ground rail via a further NMOS transistor 624, controlled at its gate by a logic signal EN for enabling or disabling the circuit. The gates of the transistors 620 and 622 are also for example coupled to the gate and drain of a further transistor 626, which for example has its source coupled to the ground rail, and receives at its drain a reference current IREF setting the current I3.

The currents I1 and I2 are for example respectively used to generate, using appropriate current sources, the currents I+ΔI supplied to the nodes 410 and 414 of the ILO 104, and the currents I−ΔI supplied to the nodes 410 and 414 of the ILO 106. For example, the drain of transistor 606 is coupled to the drain of a PMOS transistor 630, which has its source coupled to the supply rail VDD. The transistor 630 has its gate coupled to its drain. Further PMOS transistors 632 and 634 for example have their gates coupled to the gate of the transistor 630, and have their sources coupled to the supply voltage VDD such that the currents I+ΔI are provided at their drains. Similarly, the drain of transistor 610 is coupled to the drain of a PMOS transistor 636, which has its source coupled to the supply rail VDD. The transistor 636 has its gate coupled to its drain. Further PMOS transistors 638 and 640 for example have their gates coupled to the gate of the transistor 636, and have their sources coupled to the supply voltage VDD such that the currents I−ΔI are provided at their drains.

In some embodiments, the amount of phase shift applied to the synchronization signal VSYNC by each ILO 104, 106 has an upper limit defined by the full scale of the ILO, as will now be described with reference to FIGS. 7A and 7B.

Figure 7A:
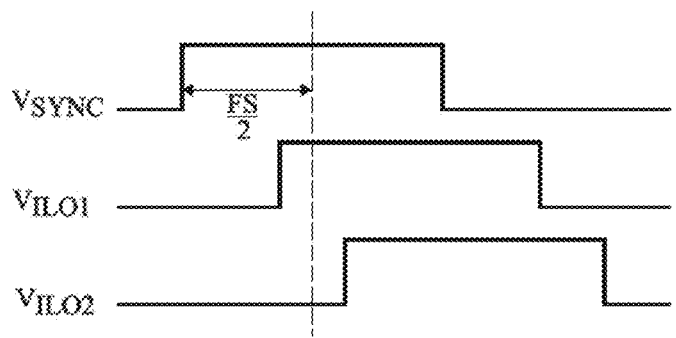
FIGS. 7A and 7B are timing diagrams illustrating signals in the interface of FIG. 1 according to an example embodiment.
Figure 7B:
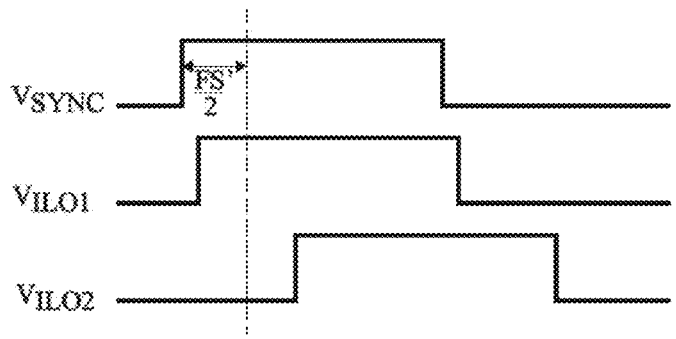

FIGS. 7A and 7B are timing diagrams representing the signals VSYNC, VILO1 and VILO2 of the interface circuit 100 of FIG. 1.

FIG. 7A illustrates the case in which there is a sensor signal and the frequencies fSYNC and f0 are identical. In such a case the full scale FS is equal to substantially TSYNC/2.

FIG. 7B illustrates an alternative case in which the frequencies fSYNC and f0 are no longer equal, implying a common phase shift of the signals VILO1, VILO2 before the sensor signal is applied. The full scale of the interface is thus reduced to a value FS', as the signal VILO1 cannot have edges occurring earlier than the corresponding edges of the signal VSYNC.

To address this issue, the counter circuit 112 of the output circuit 110 is for example adapted to measure a phase offset Rtd1 between the signal VILO1 and the signal VSYNC, and a phase offset Rtd2 between the signal VILO2 and the signal VSYNC. Ideally, the average phase offset (Rtd1+Rdt2)/2 should equal the maximum full scale FSMAX, equal for example to TSYNC/2. If the average phase offset is different from FSMAX, the free-running oscillation frequency of each of the ILOs 104, 106 is for example adjusted, for example by adjusting the biasing current of the ILOs, for example by controlling currents provided by the variable current sources 450, 452 of FIG. 4. For example, the current is decreased in order to increase the average phase offset, or increased in order to reduce the average phase offset.

While the use of the counter circuit 112 to measure the phase offset Rtd1 implies a digital control loop, in alternative embodiments an analog control loop could be implemented, for example based directly on the outputs of the ILOs.

Furthermore, while the output circuit 110 of FIG. 1 is based on a digital counter, other implementations would be possible. For example, implementations based on a SAR (successive approximation analog-to-digital converter) and a sigma-delta modulator will now be described with reference to FIGS. 8A, 8B, 9A and 9B.

Figure 8A:
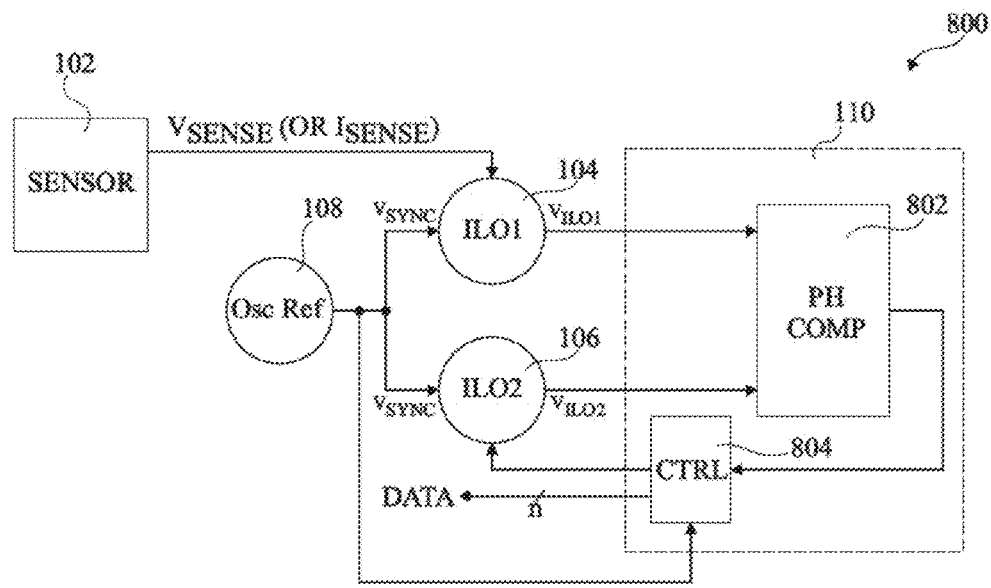
FIGS. 8A and 8B schematically illustrate sensor interfaces based on a SAR (successive approximation analog-to-digital converter) approach according to embodiments of the present disclosure.

FIG. 8A schematically illustrates a sensor interface 800 according to a further example embodiment, which is similar to the embodiment of FIG. 1, and like features have been labelled with like reference numerals and will not be described again in detail.

The example of FIG. 8A is based on a SAR (successive approximation analog-to-digital converter) implementation, in which the output circuit 110 comprises a phase comparator 802 having inputs coupled to the outputs of the ILOs 104, 106 for receiving the signals VILO1 and VILO2, and a control circuit 804 coupled to the output of the phase comparator 802. The control circuit 804 generates an n-bit output data signal DATA, and is for example clocked by the synchronization signal VSYNC or by a signal derived therefrom. The output of the sensor 102 is for example a single-ended signal coupled only to the ILO 104. An output of the control circuit 804 is coupled to the input of the ILO 106 for controlling its free-running oscillation frequency f0'. In some embodiments, the control circuit 804 comprises a digital to analog converter (not illustrated in FIG. 8A) for generating the output signal to the ILO 106.

In operation, the phase comparator 802 will detect the phase offset between the signals VILO1 and VILO2, and the control circuit 804 generates, based on the phase comparison, successive bits of a digital control signal. This digital control signal is then converted into a current level applied to the ILO 106 to adjust the phase shift it introduces. This feedback loop will iteratively converge to a value of the control signal resulting in a phase shift of the ILO 106 that matches the phase shift introduced by the ILO 104. The digital value of the control signal thus represents the sensor output signal VSENSE, and provides an n-bit output data signal DATA.

Figure 8B:
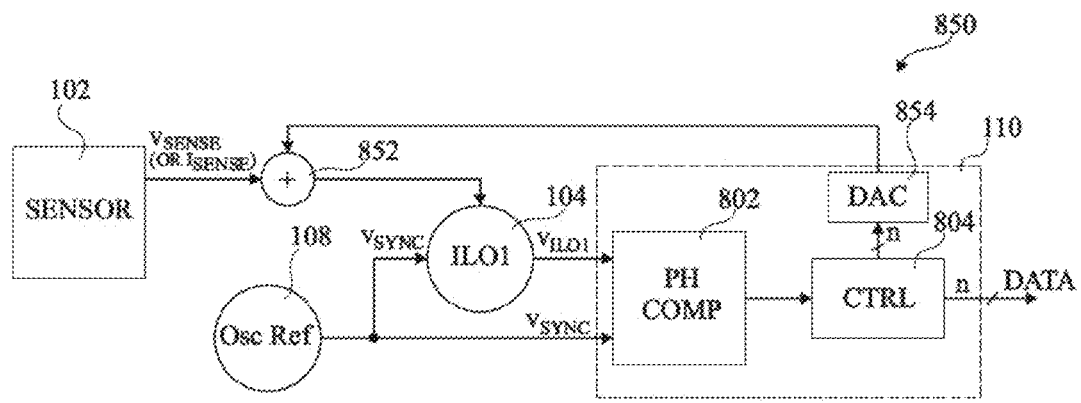

FIG. 8B illustrates an interface circuit 850 similar to that of FIG. 8A, and also based on a SAR implementation. A difference is that the interface circuit 850 is based on one ILO 104, the ILO 106 being omitted. In this example, the phase comparator 802 compares the output signal VILO1 of the oscillator 104 directly with the synchronization signal VSYNC. In some embodiments, calibration can be used to counteract any frequency mismatch between the ILO free-running frequency and the synchronization frequency. The control circuit 804 of FIG. 8B generates an n-bit output data signal DATA, and is for example clocked by the synchronization signal VSYNC or by a signal derived therefrom. The control circuit 804 is for example configured to apply the generated signal as an analog current or voltage signal added to the output signal of the sensor at a node 852, before this signal is supplied to the oscillator 104. Thus in some embodiments the output circuit 110 comprises a digital to analog converter (DAC) 854 coupled to the output of the control circuit 804 and adapted to convert the digital output signal DATA from the control circuit 804 into the analog current or voltage signal provided to the node 852.

Figure 9A:
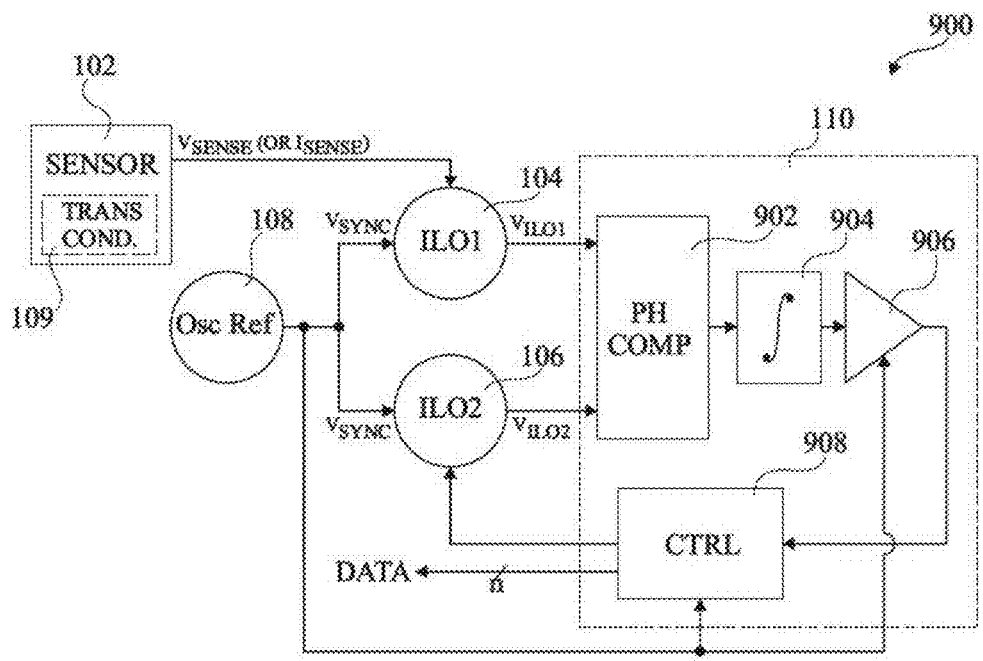
FIGS. 9A and 9B schematically illustrate sensor interfaces based sigma-delta modulation according to further example embodiments of the present disclosure.

FIG. 9A illustrates an interface circuit 900, similar to that of FIG. 8A, but in which the control circuit is based on sigma-delta modulation. The outputs of the oscillators 104 and 106 are coupled to a phase comparator 902, which provides an output signal to a sigma-delta modulator 904. The sigma-delta modulator 904 has its output coupled to a comparator 906, which generates a digital output stream to a control circuit 908. The comparator 906 provides the function of an analog to digital converter. The comparator 906 and/or the control circuit 908 are for example clocked by the synchronization signal VSYNC or by a signal derived therefrom. In some embodiments, the digit output stream of the comparator 906 is a 1-bit signal, while in other embodiments it could be a signal having three or more voltage discrete levels. The control circuit 908 for example generates an n-bit digital value based on the digital output stream of the comparator 906, although in alternative embodiments the output stream of the comparator 906 could directly provide the output signal DATA. The control circuit 908 for example generates a current signal applied to the ILO 106. Operation of the control circuit 908 is similar to that of the control circuit 804 in the embodiment of FIG. 8A, except that the current signal is generated based on a sigma-delta signal rather than using a SAR. In accordance with the operation of a sigma-delta converter, in some embodiments, rather than remaining at a relatively constant level, the feedback signal provided by the control circuit 908 to the ILO 106 switches between two or more discrete levels based on the output of the comparator 906.

Figure 9B:
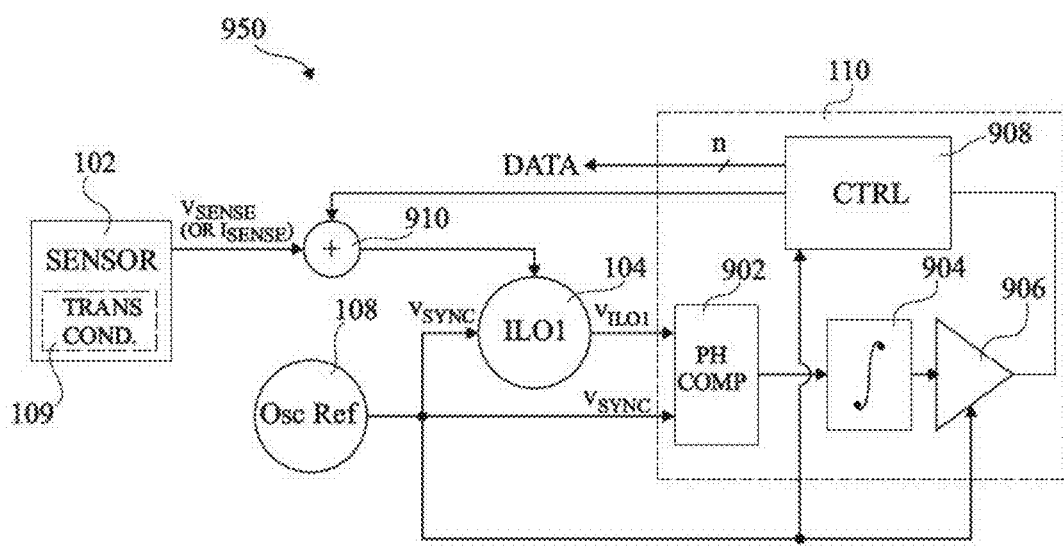

FIG. 9B illustrates an interface circuit 950 similar to that of FIG. 9A, but based on a single ILO 104, like the implementation of FIG. 8B. Thus the output of the control circuit 908 is added to the output signal of the sensor 102 at a node 910, before this signal is applied to the ILO 104.

An advantage of the embodiments described herein is that, by using one or more ILOs to convert a sensor signal into a phase shift, the circuit is particularly robust against parameter variations that may result from hostile environments.

An advantage of using an output circuit implementing a time to digital converter, which generates a digital output signal based on a phase difference, is that such a circuit can be implemented using mostly digital logic components having relatively low sensitivity to environmental conditions, and in particular to temperature variations. Furthermore, such logic components can be implemented using low voltage devices, leading to low power consumption.

A further advantage of the embodiments described herein is that they use a single reference oscillator 108 generating a single synchronization signal VSYNC, thereby providing a relatively low cost solution.

An advantage of providing an output circuit clocked by the synchronization signal VSYNC is that this leads to a high quality digital output signal, with relatively low conversion noise, i.e. jitter.

Furthermore, an advantage of the embodiments of FIGS. 8A to 9B is that the output circuit can operate at a relatively low frequency, leading to low power consumption, and in some embodiments the synchronization signal can be used to directly clock these output circuits without frequency multiplication.

Having thus described at least one illustrative embodiment, various alterations, modifications and improvements will readily occur to those skilled in the art. For example, it will be apparent to those skilled in the art that some or all of the n-channel MOS transistors described in the various circuits could be replaced, in alternative embodiments, by p-channel MOS transistors, and vice-versa. Furthermore, rather than being implemented using MOS transistor technology, other transistor technologies could be used.

Furthermore, the various features described in relation with the various embodiments could be combined, in alternative embodiments, in any combination. For example, it will be apparent to those skilled in the art that the embodiment of FIG. 1 could be adapted to be based on a single ILO, in a similar fashion to the embodiments of FIGS. 8B and 9B.

The invention claimed is:

1. An interface circuit for a sensor comprising:
   a first injection-locked oscillator having:
      a first input coupled to a sensor, a free-running oscillation frequency of the first injection-locked oscillator being controlled by a signal from the sensor; and
      a second input coupled to receive a synchronization signal at a reference frequency, the first injection-locked oscillator being adapted to generate an output signal at said reference frequency, the output signal being phase shifted with respect to the synchronization signal as a function of the signal from the sensor; and
   an output circuit, clocked by said synchronization signal or by a clock signal derived therefrom, and adapted to generate a digital output signal based on a phase difference between the output signal and the synchronization signal, or a further reference signal generated based on said synchronization signal.

2. The interface circuit of claim 1, wherein the output circuit is clocked by said clock signal having a frequency equal to a multiple of the frequency of the synchronization signal.

3. The interface circuit of claim 1, wherein the output circuit is adapted to generate the digital output signal based on a phase difference between the output signal and a further reference signal generated by a second injection-locked oscillator having:
   a first input for controlling a free-running oscillation frequency of the second injection-locked oscillator; and
   a second input coupled to receive the synchronization signal.

4. The interface circuit of claim 3, wherein the first input of the second injection-locked oscillator is coupled to the sensor.

5. The interface circuit of claim 4, wherein the sensor comprises first and second differential outputs, the free-running oscillation frequency of the first injection-locked oscillator being controlled based on a first differential output signal of the sensor, and the free-running oscillation frequency of the second injection-locked oscillator being controlled based on a second differential output signal of the sensor.

6. The interface circuit of claim 5, wherein the output circuit further comprises:
   a first counter adapted to determine a phase offset between the output signal of the first injection-locked oscillator and the synchronization signal;
   a second counter adapted to determine a phase offset between the output signal of the second injection-locked oscillator and the synchronization signal; and
   a calibration circuit configured to adjust the free-running oscillation frequencies of both the first and second injection-locked oscillators based on a comparison between an average of the first and second phase offsets and a reference phase offset.

7. The interface circuit of claim 3, wherein said output circuit comprises:
   a phase comparator; and
   a control circuit having an output coupled to the first input of the second injection-locked oscillator and adapted to generate a control signal for controlling the free-running oscillation frequency of the second injection-locked oscillator based on the phase comparison.

8. The interface circuit of claim 7, further comprising a sigma-delta modulator coupled to the output of the phase comparator, and a further comparator coupled to the output of the sigma-delta modulator, wherein the control circuit is adapted to generate the control signal based an output signal of the further comparator.

9. The interface circuit of claim 1, wherein said output circuit comprises:
   a phase comparator; and
   a control circuit having an output added to the first output signal of the sensor, the free-running oscillation frequency of the first injection-locked oscillator being controlled based on the sum of the first output signal and the control signal.

10. The interface circuit of claim 1, wherein the output circuit comprises a counter adapted to generate said digital output value by incrementing a count value between a first edge of the output signal of the first injection-locked oscillator and a first edge of the synchronization signal or of a further reference signal.

11. The interface circuit of claim 1, wherein the first injection-locked oscillator comprises:
   an oscillator comprising first and second capacitors charged or discharged based on a first current signal generated based on said first output signal of the sensor; and
   an injection locking circuit adapted to charge or discharge the first and second capacitors based on the synchronization signal.

12. The interface circuit of claim 11, wherein the first injection-locked oscillator further comprises a flip-flop adapted to be clocked based on a voltage across the first capacitor and reset based on a voltage across the second capacitor.

13. The interface circuit of claim 1, comprising a single oscillator, the single oscillator generating the synchronization signal.

14. The interface circuit of claim 13, wherein the synchronization signal is the only timing signal used by the interface circuit.

15. The interface circuit of claim 1, wherein the sensor outputs to the first input a voltage or current level representative of a value sensed by the sensor, wherein an oscillation phase of the first injection-locked oscillator is controlled based upon the voltage or current level.

16. A method of outputting a sensor signal comprising:
   controlling a free-running oscillation frequency of a first injection-locked oscillator by a signal from a sensor coupled to a first input of the first injection-locked oscillator;
   locking the frequency of an output signal of the first injection-locked oscillator to a reference frequency by applying a synchronization signal at the reference frequency to a second input of the first injection-locked oscillator, the output signal being phase shifted with respect to the synchronization signal as a function of the signal from the sensor; and generating, by an output circuit clocked by said synchronization signal or by a clock signal derived therefrom, a digital output signal based on a phase difference between the output signal and the synchronization signal, or a further reference signal generated based on said synchronization signal.

* * * * *